United States Patent
Henrickson

(10) Patent No.: US 9,390,211 B1
(45) Date of Patent: Jul. 12, 2016

(54) CIRCUIT PLACEMENT BASED ON FUZZY CLUSTERING

(71) Applicant: Synopsys, Inc., Mountain View, CA (US)

(72) Inventor: Lindor E. Henrickson, San Francisco, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/593,903

(22) Filed: Jan. 9, 2015

(51) Int. Cl.
*G06F 17/50* (2006.01)

(52) U.S. Cl.
CPC .......... *G06F 17/505* (2013.01); *G06F 17/5068* (2013.01); *G06F 17/5072* (2013.01)

(58) Field of Classification Search
CPC ............ G06F 17/5072; G06F 17/5068; G06F 17/505; G06F 17/5027; G06F 17/5077; G06F 17/5054; G06F 17/5081; G06F 2217/62; G06F 17/5036; G06F 2217/84; G06F 15/7867; G06F 17/5022; G06F 17/5045

USPC .................................................. 716/100–106
See application file for complete search history.

(56) References Cited

U.S. PATENT DOCUMENTS

| | | |
|---|---|---|
| 6,442,743 B1 * 8/2002 | Sarrafzadeh | G06F 17/5072 716/122 |
| 2006/0031802 A1 * 2/2006 | Alpert | G06F 17/5072 716/123 |
| 2006/0031804 A1 * 2/2006 | Alpert | G06F 17/5072 716/122 |

* cited by examiner

*Primary Examiner* — Binh Tat
(74) *Attorney, Agent, or Firm* — Park, Vaughan, Fleming & Dowler LLP; Laxman Sahasrabuddhe

(57) ABSTRACT

Systems and techniques for circuit placement are described. An electronic design automation (EDA) tool can receive a netlist for the circuit design. Next, the EDA tool can represent the netlist as a graph, and perform fuzzy clustering on the graph to obtain a set of clusters and a set of probability values. The EDA tool can then partition and place the circuit design based on the set of clusters and the set of probability values. The EDA tool can then optimize the placed circuit design. During optimization the EDA tool can reassign at least one cell to a different layout bin based on the set of probability values.

20 Claims, 5 Drawing Sheets

---

Receive a netlist for the circuit design, wherein the netlist describes interconnections between a plurality of cells
202

↓

Represent the netlist as a graph
204

↓

Perform fuzzy clustering on the graph to obtain a set of clusters and a set of probability values, wherein each probability value corresponds a probability of a given cell belonging to a given cluster
206

↓

Partition the netlist based on the set of clusters and the set of probability values to obtain a partitioned netlist
208

↓

Place the partitioned netlist to obtain a placed circuit design, wherein cells of each partition are placed in a layout bin corresponding to the partition
210

↓

Optimize the placed circuit design, wherein said optimizing reassigns at least one cell to another bin based on the set of probability values
212

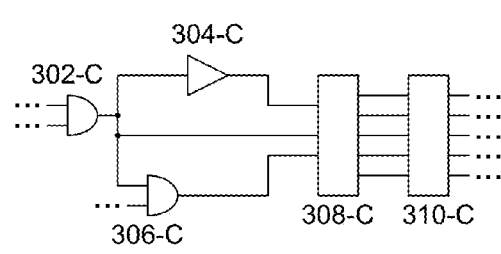 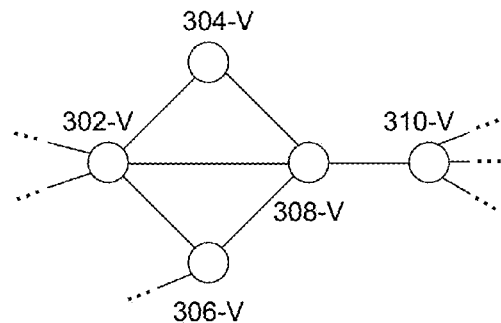
FIG. 3A  FIG. 3B
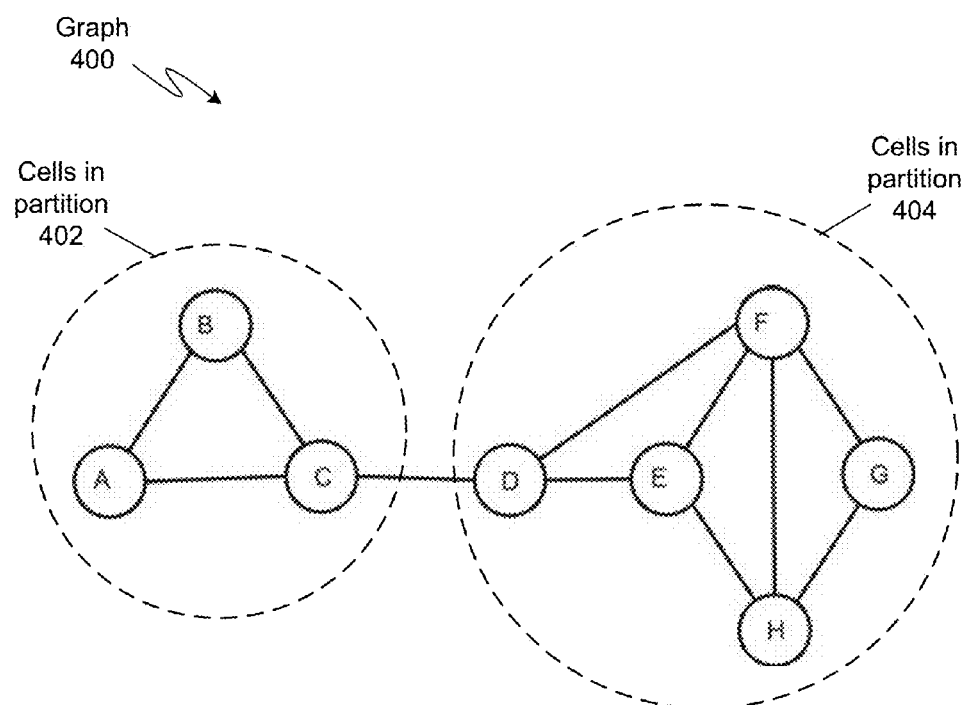
FIG. 4A

CIRCUIT PLACEMENT BASED ON FUZZY CLUSTERING

TECHNICAL FIELD

This disclosure relates to electronic design automation (EDA). More specifically, this disclosure relates to systems and techniques for circuit placement based on fuzzy clustering.

BACKGROUND

Related Art

Advances in process technology and a practically insatiable appetite for consumer electronics have fueled a rapid increase in the size and complexity of integrated circuit (IC) designs. The performance of EDA tools is very important because it reduces the time to market for IC designs.

Placement is an important step in an EDA design flow. Placement involves determining locations for placeable circuit objects (e.g., cells instances, macros, I/O pads, etc.) in the circuit design. Performing placement on large and/or analog mixed-signal circuit designs using conventional techniques can take a long time and/or lead to poor quality results. Hence, it is desirable to improve the performance and quality of results produced by an EDA tool, especially during the placement of large circuit designs.

SUMMARY

The general circuit placement problem has been shown to be NP-complete. Embodiments described in this disclosure provide systems and techniques for placing a circuit design based on fuzzy clustering. Specifically, embodiments described herein can be used to optimally place a circuit design in an analog/mixed-signal design flow. During operation, an EDA tool can receive a netlist for the circuit design, wherein the netlist describes interconnections between a plurality of cells. Next, the EDA tool can represent the netlist as a graph. The EDA tool can then perform fuzzy clustering on the graph to obtain a set of clusters and a set of probability values, wherein each probability value corresponds to a probability of a given cell belonging to a given cluster. Next, the EDA tool can partition the netlist based on the set of clusters and the set of probability values. The EDA tool can then place the partitioned netlist to obtain a placed circuit design, wherein cells of each partition are placed in a layout bin corresponding to the partition. Next, the EDA tool can optimize the placed circuit design, wherein said optimizing reassigns at least one cell to a different layout bin based on the set of probability values.

In some embodiments, the EDA tool can represent each cell as a vertex in the graph, and represent interconnections between a pair of cells as an edge between a pair of vertices corresponding to the pair of cells. Furthermore, in some embodiments, the EDA tool can assign a weight to each edge, wherein the weight is inversely proportional to the number of interconnections between the pair of cells that correspond to the pair of vertices between which the edge exists.

In some embodiments, the EDA tool can perform Fuzzy C-Means (FCM) clustering on the vertices of the graph, wherein a similarity measure between two vertices can be defined as the shortest path distance between the two vertices in the graph.

In some embodiments, the EDA tool can partition and place the circuit design by creating a set of partitions corresponding to the set of clusters, and by assigning each cell to a partition in the set of partitions based on the set of probability values. The EDA tool can optimize the placed circuit design by performing an iterative optimization process to optimize an objective function based on the placed circuit design, wherein in each iteration of the iterative optimization process at least one cell is reassigned to a different layout bin based on the set of probability values. The iterative optimization process can be terminated when the optimization function improves less than a minimum improvement threshold between two consecutive iterations or a maximum iteration limit is reached.

BRIEF DESCRIPTION OF THE FIGURES

FIGS. 3A and 3B illustrate how a netlist can be represented as a graph in accordance with some embodiments described herein.

FIG. 4A illustrates how a circuit design can be partitioned based on the set of clusters and the set of probability values in accordance with some embodiments described herein.

DETAILED DESCRIPTION

Figure 1:
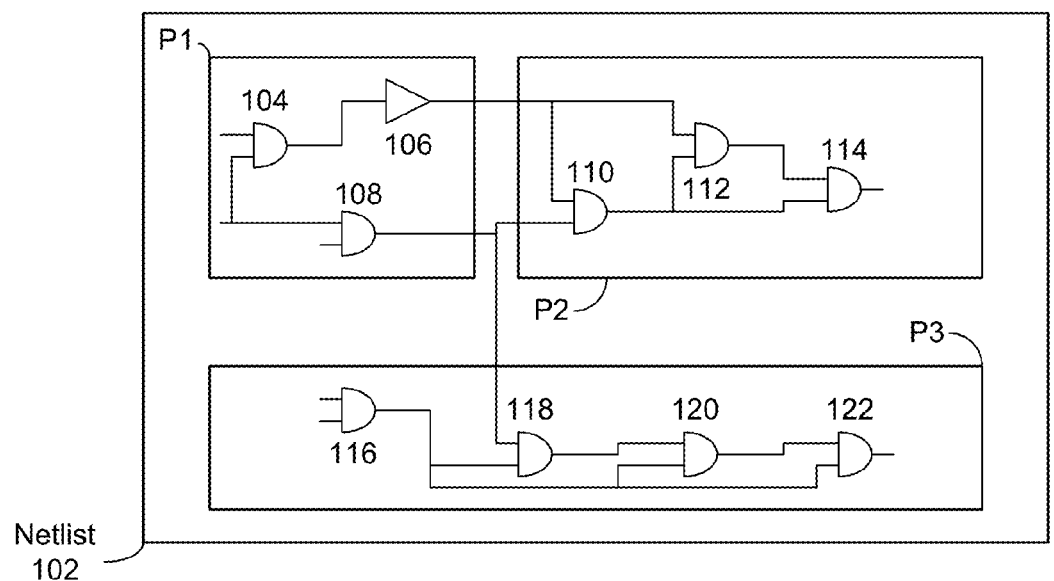
FIG. 1 illustrates how a netlist for a circuit design can be partitioned in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of an EDA Design Flow

Circuit designs are usually created by performing a sequence of circuit design steps (the sequence of steps is just a general guideline which may not be followed exactly). This sequence of design steps is referred to as an EDA design flow. An EDA design flow can include multiple steps, and each step can involve using one or more EDA software tools. Once the circuit design is finalized, it can undergo fabrication, packaging, and assembly to produce integrated circuit chips.

Some EDA steps and software tools are described below. These examples of EDA steps and software tools are for illustrative purposes only and are not intended to limit the embodiments to the forms disclosed.

Some EDA software tools enable circuit designers to describe the functionality that the circuit designers want to implement. These tools also enable circuit designers to perform what-if planning to refine functionality, check costs, etc. During logic design and functional verification, the HDL (hardware description language), e.g., Verilog, code can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout and can be electrically coupled.

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Circuit Placement Based on Fuzzy Clustering

Some placers (i.e., EDA tools that perform placement on a circuit design) use partitioning, which generally refers to a process of dividing the netlist into a collection of smaller parts called partitions. Specifically, a placer can place a circuit design by recursively partitioning the circuit design. For example, the entire design can be partitioned into a set of partitions, and then each partition in the set of partitions can be further partitioned into smaller partitions, and so forth.

In addition to partitioning the netlist, the placer can also recursively divide the layout area into layout bins (i.e., each layout bin is a portion of the entire layout area), and assign each netlist partition to a layout bin. Once the partitions and layout bins are sufficiently small, the placer can then perform detailed placement for each netlist partition within the layout bin assigned to the netlist partition. Although such approaches speed up the overall placement process, performing hard partitioning in the electrical/logical domain can lead to sub-optimal choices in the physical/layout domain. In particular, approaches based on hard netlist partitioning often result in sub-optimal solutions for analog mixed-signal designs where cell instances may be irregularly shaped, disproportionately sized, or use complex design rules. Further details on conventional approaches for circuit placement can be found in Luciano Lavagno (Editor), Louis Scheffer (Editor), and Grant Martin (Editor), *EDA for IC Implementation, Circuit Design, and Process Technology*, ISBN 0-8493-7924-5, Mar. 23, 2006, which is herein incorporated by reference.

Some embodiments described herein feature methods and apparatuses that improve the performance and QoR of placers, especially for difficult circuit placement problems, e.g., those involving analog mixed-signal circuit designs. FIG. 1 illustrates how a netlist for a circuit design can be partitioned in accordance with some embodiments described herein. Netlist 102 can include cells 104, 106, 108, 110, 112, 114, 116, 118, 120, and 122. In this disclosure, the term "cell" generally refers to circuitry (e.g., an implementation of a NAND gate) that can be handled as a single unit by an EDA tool. For example, the EDA tool can store multiple cells (e.g., each of the multiple cells can correspond to a particular implementation of a NAND gate) in a cell library, instantiate a given cell from a cell library into a circuit design, etc. The symbols used in FIG. 1 to illustrate cells are generic in nature and do not imply a particular logic functionality.

As shown in FIG. 1, the cells in netlist 102 can be partitioned into partitions P1-P3. Specifically, partition P1 can include cells 104, 106, and 108; partition P2 can include cells 110, 112, and 114; and partition P3 can include cells 116, 118, 120, and 122.

Figure 2:
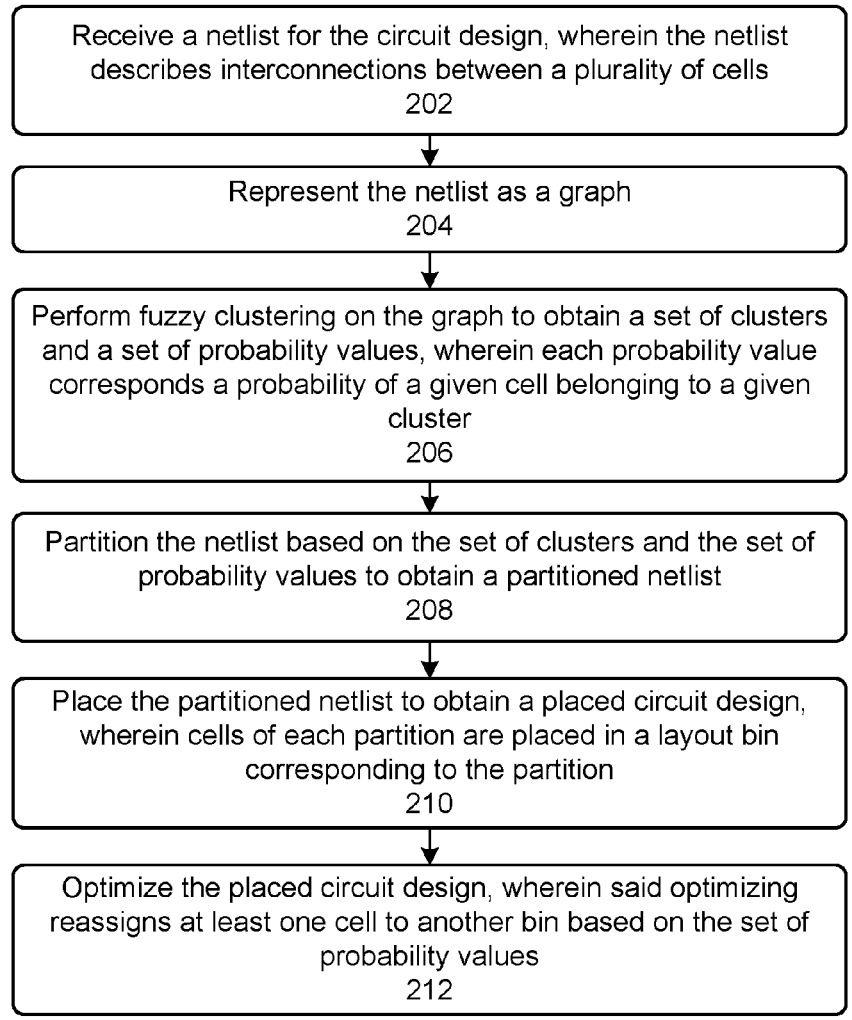
FIG. 2 illustrates a process for placing a circuit design based on fuzzy clustering in accordance with some embodiments described herein.

FIG. 2 illustrates a process for placing a circuit design based on fuzzy clustering in accordance with some embodiments described herein. The process can begin by receiving a netlist for the circuit design, wherein the netlist describes interconnections between a plurality of cells (operation 202). Next, the netlist can be represented as a graph (operation 204). Specifically, each cell can be represented as a vertex in the graph, and interconnections between a pair of cells can be represented as an edge between a pair of vertices corresponding to the pair of cells.

FIGS. 3A and 3B illustrate how a netlist can be represented as a graph in accordance with some embodiments described herein. Specifically, FIG. 3A illustrates a netlist that describes the interconnections between cells 302-C, 304-C, 306-C, 308-C, and 310-C. FIG. 3B illustrates a graph that corresponds to the netlist shown in FIG. 3A. In particular, vertices 302-V, 304-V, 306-V, 308-V, and 310-V correspond to cells 302-C, 304-C, 306-C, 308-C, and 310-C, respectively. Each edge in the graph illustrated in FIG. 3B corresponds to one or more interconnections between two cells in the netlist illustrated in FIG. 3A. For example, the edge between vertices 302-V and 304-V corresponds to the interconnection between cells 302-C and 304-C Likewise, the five interconnections between cells 308-C and 310-C are represented by the single edge between vertices 308-V and 310-V.

Some conventional placers represent a netlist by a hypergraph H=(V, E), where V is the set of vertices, and E is the set of hyperedges. In this representation, each vertex corresponds to a cell, and each hyperedge corresponds to a net that interconnects two or more cells. The hypergraph can be converted into a graph by replacing each hyperedge by a set of edges that form a clique between the vertices that the hyperedge connects. In some embodiments, the process may first create a hypergraph based on the netlist shown in FIG. 3A, and then convert the hypergraph into the graph shown in FIG. 3B. When the hypergraph is converted into a graph, the resulting graph may have multiple edges between two vertices. If that happens, the process can decide to keep only one edge from the multiple edges in the graph.

Continuing with the description of FIGS. 3A-3B, a weight can be assigned to each edge in the graph, wherein the weight is inversely proportional to the number of interconnections between the pair of cells that correspond to the pair of vertices between which the edge exists. In some embodiments, the weight of an edge can be equal to (1/N) where N is the number of interconnections between the pair of cells that correspond to the pair of vertices between which the edge exists. For example, the weight of the edge between vertices 302-V and 304-V can be 1 (=1/1) because this edge represents a single interconnection between cells 302-C and 304-C, and the weight of the edge between vertices 308-V and 310-V can be 0.2 (=1/5) because this edge represents five interconnections between cells 308-C and 310-C.

Once a graph has been created, the process can then perform fuzzy clustering on the graph to obtain a set of clusters and a set of probability values, wherein each probability value corresponds to a probability of a given cell belonging to a given cluster (operation 206). Fuzzy clustering of a graph is analogous to fuzzy logic in that every vertex has a degree of belonging (e.g., a probability of belonging) to clusters, rather than belonging completely to just one cluster. Thus, vertices that are near the "boundary" of a cluster may be in the cluster to a lesser degree than vertices in the center of cluster.

In some embodiments, performing fuzzy clustering on the graph comprises performing Fuzzy C-Means (FCM) clustering on the vertices of the graph. The similarity measure between two vertices can be equal to the shortest path distance between the two vertices in the graph. Further details of FCM clustering can be found in numerous texts, such as Bezdek, James C. (1981), *Pattern Recognition with Fuzzy Objective Function Algorithms*, ISBN 0-306-40671-3, which is herein incorporated by reference.

In some embodiments, the EDA tool may perform fuzzy clustering based on a user-specified number of clusters. In other embodiments, the EDA tool may perform fuzzy clustering for a range of number of clusters (e.g., perform fuzzy clustering by assuming 10 clusters, 11 clusters, and so forth up to 20 clusters) and then allow the user to select the number of clusters based on the results obtained for the different numbers of clusters. In some embodiments the EDA tool may adaptively compute the "optimal" number of clusters automatically, thus relieving the user from having to choose the number of clusters either a priori or a posteriori.

The embodiments described herein are not limited to using FCM clustering, and can generally use any fuzzy clustering technique that can cluster vertices in a graph based on an appropriate similarity measure between vertices, e.g., a similarity measure that is equal to the shortest path distance between two vertices in a graph. For example, details of other fuzzy clustering techniques that can be used in place of FCM clustering can be found in Nock, R. and Nielsen, F. (2006), "On Weighting Clustering," *IEEE Trans. on Pattern Analysis and Machine Intelligence,* 28 (8), 1-13, which is herein incorporated by reference.

Next, the netlist can be partitioned based on the set of clusters and the set of probability values to obtain a partitioned netlist (operation 208). Specifically, the EDA tool can create a set of partitions corresponding to the set of clusters, and each cell can be assigned to a partition that corresponds to the cluster for which the cell has the highest probability of belonging.

FIG. 4A illustrates how a circuit design can be partitioned based on the set of clusters and the set of probability values in accordance with some embodiments described herein. Graph 400 has been created based on a circuit design that includes cells named A-H. Each vertex in graph 400 is labeled with the same name as the cell that the vertex represents, and the terms "cell" and "vertex" are used interchangeably in this paragraph for ease of discourse. Let us assume that a fuzzy clustering process when applied to graph 400 determines that cells A-H belong to cluster C1 with probabilities 0.9, 0.9, 0.7, 0.48, 0.2, 0.2, 0.1, and 0.1, respectively, and that cells A-H belong to cluster C2 with probabilities 0.1, 0.1, 0.3, 0.52, 0.8, 0.8, 0.9, and 0.9, respectively. In this example, the EDA tool can create two partitions, wherein each partition corresponds to a cluster, and then use the probability values to assign cells to the partitions. For example, the EDA tool can create partition 402 corresponding to cluster C1 and partition 404 corresponding to cluster C2. Next, cells A-C can be assigned to partition 402 because the probability that these cells belong to cluster C1 is greater than the probability that these cells belong to cluster C2 Likewise, cells D-H can be assigned to partition 404 because the probability that these cells belong to cluster C2 is greater than the probability that these cells belong to cluster C1.

Figure 4B:
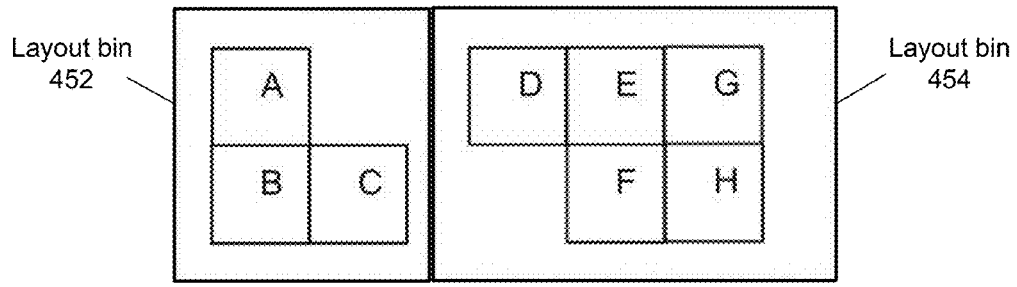
FIG. 4B illustrates a placed circuit design in accordance with some embodiments described herein.

Continuing with the description of FIG. 2, the process can then place the partitioned netlist to obtain a placed circuit design, wherein cells of each partition are placed in a layout bin corresponding to the partition (operation 210). FIG. 4B illustrates a placed circuit design in accordance with some embodiments described herein. Layout bins 452 and 454 correspond to partitions 402 and 404, respectively. Cells A-C have been assigned to layout bin 452 because these cells belong to cluster C1, and cells D-H have been assigned to layout bin 454 because these cells belong to cluster C2.

The initial placement that is performed based on the netlist partitions may not be the optimal circuit placement. Conventional placers do not move cells between bins during optimization. Additionally, conventional placers do not use cluster membership probabilities to guide the optimization process. In contrast to conventional placers, some embodiments described herein can optimize the placed circuit design, wherein said optimizing reassigns at least one cell to another bin based on the set of probability values (operation 212). Specifically, the process can use the cluster membership probabilities as "hints" to move cells to different bins based on their cluster membership probabilities, thereby significantly reducing the solution space that needs to be explored to reach a globally optimal circuit placement solution. Using the cluster membership probabilities to guide placement optimization is an important insight that enables embodiments described herein to perform circuit placement in a manner that is computationally efficient and that produces high quality of results.

In some embodiments, the EDA tool can iteratively optimize a placement objective function, wherein in each iteration of the iterative optimization process at least one cell is reassigned to a different bin based on the set of probability values. The objective function can generally be any metric or any combination of metrics that relates to the quality of the circuit placement. For example, the objective function may relate to the number of timing violations, or may relate to the amount of routing congestion, or may relate to a combination of these two metrics. Other metrics that can be used in the objective function include, but are not limited to, minimization of total placed circuit area, and minimization of weighted circuit connection or routing lengths.

Figure 5:
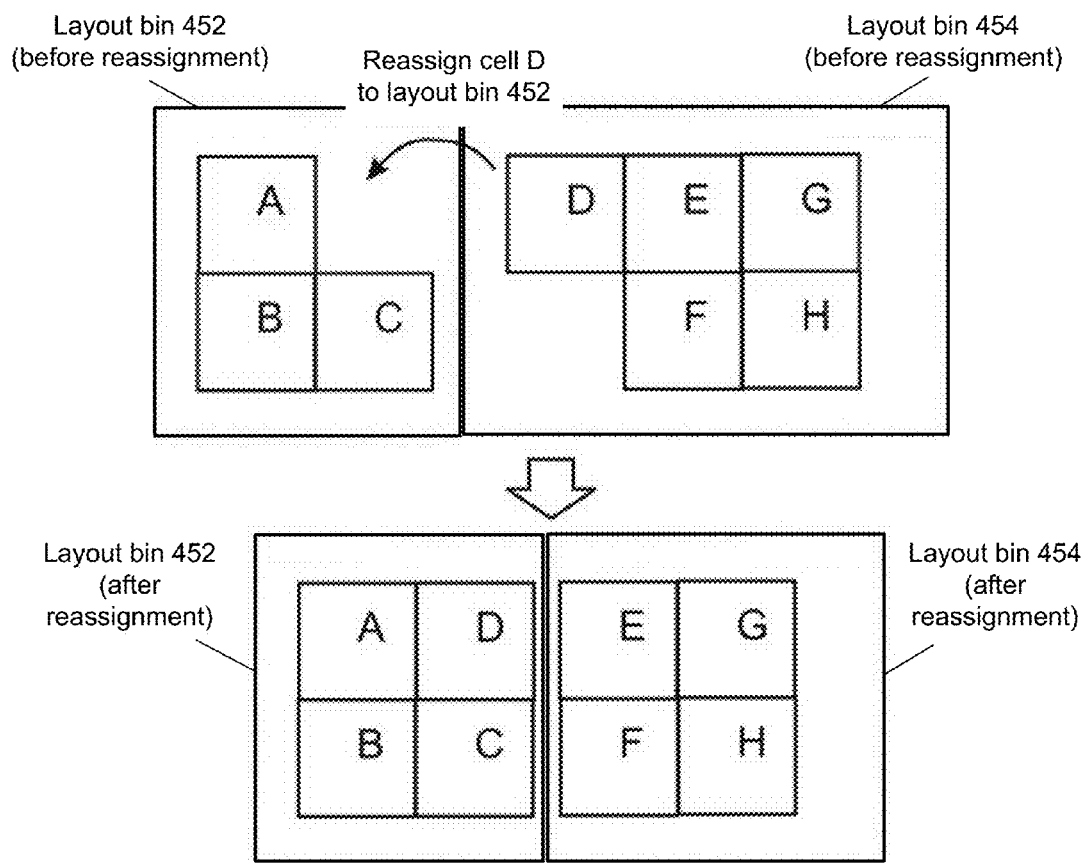
FIG. 5 illustrates how the set of probability values can be used during an iterative optimization process in accordance with some embodiments described herein.

FIG. 5 illustrates how the set of probability values can be used during an iterative optimization process in accordance with some embodiments described herein. The top half of FIG. 5 illustrates the initial placement that was determined in FIG. 4B. Note that cell D had a probability of 0.52 of belonging to cluster C2 and a probability of 0.48 of belonging to cluster C1. Therefore, cell D was initially placed in layout bin 404 which corresponds to cluster C2. However, during the iterative optimization process, cell D can be reassigned to layout bin 402 as shown in the bottom half of FIG. 5. Note that the shapes and/or sizes of the layout bins may change after the cells are reassigned during optimization.

In some embodiments, the user may specify a range of probability values (e.g., 0.4-0.6), and the EDA tool can identify all cells whose probabilities fall within the user-specified range of probability values. Next, the EDA tool can generate a set or a sequence of placement perturbations based on the identified cells. A placement perturbation can generally include one or more cell reassignments, e.g., a placement perturbation could be "reassign cell D from layout bin 404 to layout bin 402" or "reassign cell D from layout bin 404 to layout bin 402 and reassign cell C from layout bin 402 to layout bin 404."

Another example for generating placement perturbations is as follows. First, the probabilities for a given cell can be sorted in decreasing order, and all layout bins that are within a given range of the maximum probability can be selected for generating placement perturbations. For example, if the maximum probability for the given cell is 0.3 (let us assume that this probability corresponds to the cell belonging to layout bin B1 which corresponds to cluster CL1), and if the probability range is 0.1 (alternatively, the range can be specified as a percentage), then all layout bins for whom the cell has a probability between 0.2-0.3 can be selected for generating placement perturbations. For example, if the probabilities for the given cell to belong to layout bins B2 and B3 (which correspond to clusters CL2 and CL3, respectively) are within the range 0.2-0.3, then the following sequence of placement perturbations can be generated: "reassign the cell from layout bin B1 to layout bin B2" and "reassign the cell from layout bin B2 to layout bin B3."

These examples for generating and using placement perturbations based on the set of membership probabilities have been presented for purposes of illustration and description. They are not intended to be exhaustive or to limit the invention to the forms disclosed.

In some embodiments, the iterative optimization process can be terminated when the placement objective function improves less than a minimum improvement threshold between two consecutive iterations or a maximum iteration limit is reached. The minimum improvement threshold can be specified as a percentage of the best objective function value (e.g., 1%) or as an absolute number (e.g., 0.001). The EDA tool can keep track of the change in the placement objective function over consecutive iterations or over a given number (e.g., 10) iterations. If the placement objective function does not improve at least by the minimum improvement threshold within the specified number of iterations, then the iterative optimization process can be terminated. Alternatively, a maximum iteration limit—e.g., 10,000 iterations—can be specified, and once the iterative optimization process has performed maximum number of iterations, the process can terminate. In yet another embodiment, both a minimum improvement threshold and an iteration limit can be specified, and the iterative optimization process can be terminated if either one of the two conditions is satisfied, i.e., either the improvement in the objective function is less than the minimum improvement threshold or the iteration count reaches the maximum iteration limit.

Computer System

Figure 6:
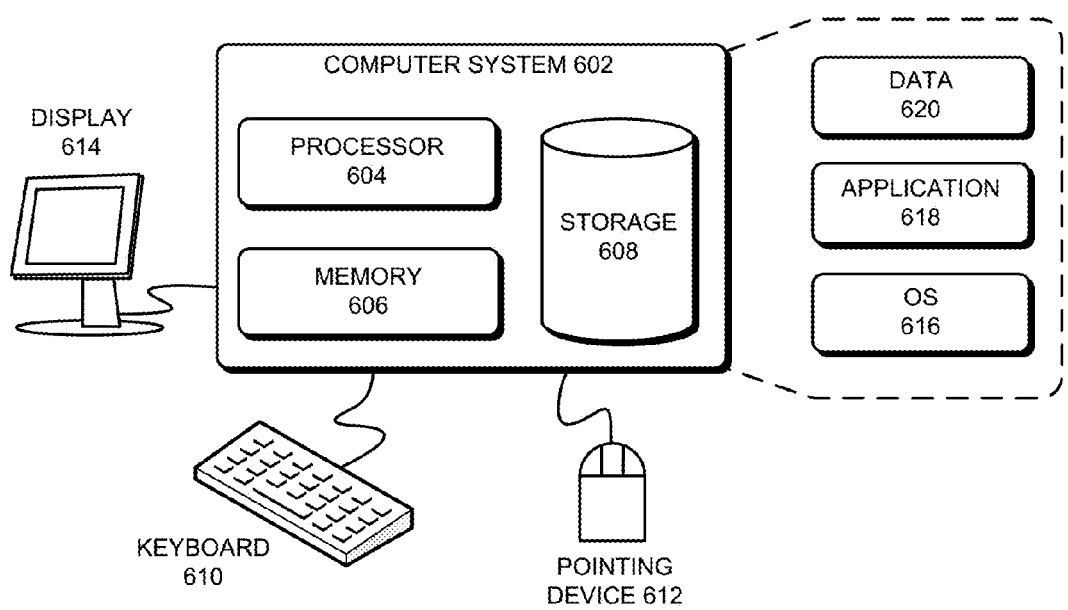
FIG. 6 illustrates a computer system in accordance with some embodiments described herein.

FIG. 6 illustrates a computer system in accordance with some embodiments described herein. Computer system 602 can include one or more processors (e.g., processor 604), memory 606, and storage device 608. Computer system 602 can be coupled to display device 614, keyboard 610, and pointing device 612. Storage device 608 can store operating system 616, application 618, and data 620. Data 620 can include input required by application 618 and/or output generated by application 618.

Computer system 602 may automatically (or with user intervention) perform one or more operations that are implicitly or explicitly described in this disclosure. For example, computer system 602 can load application 618 into memory 606, and application 618 can then be used to place a circuit design based on fuzzy clustering.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In an electronic design automation (EDA) tool, a method for placing a circuit design, the method comprising:
   receiving a netlist for the circuit design, wherein the netlist describes interconnections between a plurality of cells;
   representing the netlist as a graph;
   performing, using one or more processors, fuzzy clustering on the graph to obtain a set of clusters and a set of probability values, wherein each probability value corresponds to a probability of a given cell belonging to a given cluster;
   partitioning the netlist based on the set of clusters and the set of probability values to obtain a partitioned netlist;
   placing the partitioned netlist to obtain a placed circuit design, wherein cells of each partition are placed in a layout bin corresponding to the partition; and
   optimizing the placed circuit design, wherein said optimizing reassigns at least one cell to a different layout bin based on the set of probability values.

2. The method of claim 1, wherein said representing the netlist as the graph comprises representing each cell as a vertex in the graph, and representing interconnections between a pair of cells as an edge between a pair of vertices corresponding to the pair of cells.

3. The method of claim 2, wherein said representing the netlist as the graph further comprises assigning a weight to each edge, wherein the weight is inversely proportional to the number of interconnections between the pair of cells that correspond to the pair of vertices between which the edge exists.

4. The method of claim 3, wherein said performing fuzzy clustering on the graph comprises performing Fuzzy C-Means clustering on the vertices of the graph, wherein a similarity measure between two vertices is equal to a shortest path distance between the two vertices in the graph.

5. The method of claim 1, wherein said partitioning the circuit design comprises creating a set of partitions corresponding to the set of clusters and assigning each cell to a partition in the set of partitions based on the set of probability values.

6. The method of claim 5, wherein said optimizing the placed circuit design comprises performing an iterative optimization process to optimize an objective function based on the placed circuit design, wherein in each iteration of the iterative optimization process at least one cell is reassigned to a different layout bin based on the set of probability values.

7. The method of claim 6, wherein said optimizing the placed circuit design comprises terminating the iterative optimization process when the optimization function improves less than a minimum improvement threshold between two consecutive iterations or a maximum iteration limit is reached.

8. A non-transitory computer-readable storage medium storing instructions that, when executed by a computer, cause the computer to perform a method for placing a circuit design, the method comprising:
receiving a netlist for the circuit design, wherein the netlist describes interconnections between a plurality of cells;
representing the netlist as a graph;
performing fuzzy clustering on the graph to obtain a set of clusters and a set of probability values, wherein each probability value corresponds to a probability of a given cell belonging to a given cluster;
partitioning the netlist based on the set of clusters and the set of probability values to obtain a partitioned netlist;
placing the partitioned netlist to obtain a placed circuit design, wherein cells of each partition are placed in a layout bin corresponding to the partition; and
optimizing the placed circuit design, wherein said optimizing reassigns at least one cell to a different layout bin based on the set of probability values.

9. The non-transitory computer-readable storage medium of claim 8, wherein said representing the netlist as the graph comprises representing each cell as a vertex in the graph, and representing interconnections between a pair of cells as an edge between a pair of vertices corresponding to the pair of cells.

10. The non-transitory computer-readable storage medium of claim 9, wherein said representing the netlist as the graph further comprises assigning a weight to each edge, wherein the weight is inversely proportional to the number of interconnections between the pair of cells that correspond to the pair of vertices between which the edge exists.

11. The non-transitory computer-readable storage medium of claim 10, wherein said performing fuzzy clustering on the graph comprises performing Fuzzy C-Means clustering on the vertices of the graph, wherein a similarity measure between two vertices is equal to a shortest path distance between the two vertices in the graph.

12. The non-transitory computer-readable storage medium of claim 8, wherein said partitioning the circuit design comprises creating a set of partitions corresponding to the set of clusters and assigning each cell to a partition in the set of partitions based on the set of probability values.

13. The non-transitory computer-readable storage medium of claim 12, wherein said optimizing the placed circuit design comprises performing an iterative optimization process to optimize an objective function based on the placed circuit design, wherein in each iteration of the iterative optimization process at least one cell is reassigned to a different layout bin based on the set of probability values.

14. The non-transitory computer-readable storage medium of claim 13, wherein said optimizing the placed circuit design comprises terminating the iterative optimization process when the optimization function improves less than a minimum improvement threshold between two consecutive iterations or a maximum iteration limit is reached.

15. An apparatus, comprising:
one or more processors; and
a non-transitory computer-readable storage medium storing instructions that, when executed by the one or more processors, cause the apparatus to perform a method for placing a circuit design, the method comprising:
receiving a netlist for the circuit design, wherein the netlist describes interconnections between a plurality of cells;
representing the netlist as a graph;
performing fuzzy clustering on the graph to obtain a set of clusters and a set of probability values, wherein each probability value corresponds to a probability of a given cell belonging to a given cluster;
partitioning the netlist based on the set of clusters and the set of probability values to obtain a partitioned netlist;
placing the partitioned netlist to obtain a placed circuit design, wherein cells of each partition are placed in a layout bin corresponding to the partition; and
optimizing the placed circuit design, wherein said optimizing reassigns at least one cell to a different layout bin based on the set of probability values.

16. The apparatus of claim 15, wherein said representing the netlist as the graph comprises representing each cell as a vertex in the graph, and representing interconnections between a pair of cells as an edge between a pair of vertices corresponding to the pair of cells.

17. The apparatus of claim 16, wherein said representing the netlist as the graph further comprises assigning a weight to each edge, wherein the weight is inversely proportional to the number of interconnections between the pair of cells that correspond to the pair of vertices between which the edge exists.

18. The apparatus of claim 17, wherein said performing fuzzy clustering on the graph comprises performing Fuzzy C-Means clustering on the vertices of the graph, wherein a similarity measure between two vertices is equal to a shortest path distance between the two vertices in the graph.

19. The apparatus of claim 15, wherein said partitioning the circuit design comprises creating a set of partitions corresponding to the set of clusters and assigning each cell to a partition in the set of partitions based on the set of probability values.

20. The apparatus of claim 19, wherein said optimizing the placed circuit design comprises performing an iterative optimization process to optimize an objective function based on the placed circuit design, wherein in each iteration of the iterative optimization process at least one cell is reassigned to a different layout bin based on the set of probability values, and wherein the iterative optimization process is terminated when the optimization function improves less than a minimum improvement threshold between two consecutive iterations or a maximum iteration limit is reached.

* * * * *

UNITED STATES PATENT AND TRADEMARK OFFICE
CERTIFICATE OF CORRECTION

| | |
|---|---|
| PATENT NO. | : 9,390,211 B1 |
| APPLICATION NO. | : 14/593903 |
| DATED | : July 12, 2016 |
| INVENTOR(S) | : Lindor E. Henrickson |

It is certified that error appears in the above-identified patent and that said Letters Patent is hereby corrected as shown below:

In the specification (at column 5, line 35), delete the word, "netlest" and replace with the word --netlist--.

Signed and Sealed this
Twenty-third Day of August, 2016

Michelle K. Lee
*Director of the United States Patent and Trademark Office*